United States Patent
Omoto

(10) Patent No.: US 7,379,345 B2
(45) Date of Patent: *May 27, 2008

(54) NONVOLATILE SEMICONDUCTOR MEMORY DEVICE THAT ACHIEVES SPEEDUP IN READ OPERATION

(75) Inventor: Kayoko Omoto, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/785,561

(22) Filed: Apr. 18, 2007

(65) Prior Publication Data
US 2007/0195601 A1   Aug. 23, 2007

Related U.S. Application Data

(63) Continuation of application No. 11/115,298, filed on Apr. 27, 2005, now Pat. No. 7,263,002.

(30) Foreign Application Priority Data

Apr. 28, 2004   (JP)   ............................. 2004-133978

(51) Int. Cl.
G11C 16/06   (2006.01)
(52) U.S. Cl. ............................. 365/185.25; 365/185.11; 365/185.13
(58) Field of Classification Search .......... 365/185.11, 365/185.13, 185.25
See application file for complete search history.

(56) References Cited

U.S. PATENT DOCUMENTS

| | | | |
|---|---|---|---|
| 6,480,418 B2 | 11/2002 | Tanaka et al. | |
| 6,584,005 B1 | 6/2003 | Kato et al. | |
| 6,781,904 B2 | 8/2004 | Lee et al. | |
| 6,795,346 B2 | 9/2004 | Otani et al. | |
| 7,002,848 B2 | 2/2006 | Takase et al. | |
| 7,263,002 B2 * | 8/2007 | Omoto | ................... 365/185.25 |

FOREIGN PATENT DOCUMENTS

| JP | 11-191298 | 7/1999 |
|---|---|---|
| JP | 2002-334593 | 11/2002 |

OTHER PUBLICATIONS

Hiraki et al., "MP 6.8 A3.3V 90MHz Flash Memory Module Embedded in a 32b RISC Microcontroller", ISSCC99, pp. 116-117.

* cited by examiner

*Primary Examiner*—Hoai V Ho
(74) *Attorney, Agent, or Firm*—Buchanan, Ingersoll & Rooney PC

(57) ABSTRACT

A plurality of first sub-bit lines are each connected to a common source line via a corresponding first sub-bit line reset transistor with NMOS structure, and a plurality of second sub-bit lines are each connected to the common source line via a corresponding second sub-bit line reset transistor with NMOS structure. The plurality of first and second sub-bit line reset transistors have their respective gates receiving a sub-bit line reset signal. This sub-bit line reset signal becomes "H" for a predetermined period of time after read data is obtained during a read period.

3 Claims, 8 Drawing Sheets

NONVOLATILE SEMICONDUCTOR MEMORY DEVICE THAT ACHIEVES SPEEDUP IN READ OPERATION

CROSS REFERENCE TO RELATED APPLICATION

This application is a continuation application of application Ser. No. 11/115,298, filed Apr. 27, 2005, now U.S. Pat. No. 7,263,002.

BACKGROUND OF THE INVENTION

1. Field of the Invention

The present invention relates to a nonvolatile semiconductor memory device such as an electrically rewritable flash memory, and more particularly to a technique for speeding up read operation of the device.

2. Description of the Background Art

A nonvolatile semiconductor memory device such as a flash memory is capable of nonvolatile storage of information by setting each of a plurality of memory transistors forming a memory cell array either to an "H" threshold voltage $VthH$ which is a threshold value higher than read voltage, or to an "L" threshold voltage $VthL$ which is lower than read voltage. The plurality of memory transistors are generally arranged in a matrix such that the drains (drain electrodes) thereof in each column are connected to a bit line, the gates (gate electrodes) thereof in each row are connected to a word line, and the sources (source electrodes) thereof are connected to a common source line.

Speedup is achieved by forming the above bit line used in a nonvolatile semiconductor memory device in a hierarchy that is composed of a main bit line and a sub-bit line. Japanese Patent Application Laid-Open No. 11-191298 (1999) further discloses a nonvolatile semiconductor memory device in which a first transistor for connecting a main bit line and a sub-bit line and a second transistor for discharging the sub-bit line are complimentarily turned on/off.

The nonvolatile semiconductor memory device disclosed in JP 11-191298, however, requires the same number of control signal lines for the first transistor and the second transistor, putting restrictions on wiring in terms of layout. This poses a first problem of an increase in area.

In addition, in JP 11-191298 where the sources of a plurality of memory transistors are connected to a single common source line as discussed above, the common source line is subjected to fluctuations in fixed potential. This poses a second problem of a decline in read operation. This second problem will be described below in detail.

When performing two sequential read operations by selecting a predetermined sub-bit line at the first reading and not selecting it at the second reading, the predetermined sub-bit line is discharged at the second reading when not selected. Thus, it is likely that a certain amount of charge on the predetermined sub-bit line that has been precharged at the first reading remains at the start of the second reading. Particularly when a selected memory transistor has the "H" threshold voltage $VthH$ (which is not turned on with read voltage), the charge on the predetermined sub-bit line that has been generated at the first reading remains reliably without being discharged to the common source line via the selected memory transistor.

The remaining charge affects potential fluctuations of the common source line at the second reading. For example, there always exists a non-selected memory transistor having a gate connected to a selected word line to which a read voltage is supplied at the second reading, and a drain connected to the above predetermined sub-bit line. This non-selected memory transistor enters an on state when having the "L" threshold voltage $VthL$, so the charge on the above predetermined sub-bit line flows into the common source line via this non-selected memory transistor. This will result in greater fluctuations in fixed potential of the common source line at the second reading than initially predicted. And the amount of current flowing through the main bit line will be limited with the fluctuations in fixed potential of the common source line, resulting in a decline in read operation.

SUMMARY OF THE INVENTION

It is an object of the present invention to provide a nonvolatile semiconductor memory device that achieves speedup in read operation by solving the problem of decline in read operation resulting from fluctuations in fixed potential of a common source line.

In an aspect of the present invention, a nonvolatile semiconductor memory device includes a plurality of memory transistors, a main bit line, a plurality of sub-bit lines, and resetting means.

Each of the plurality of memory transistors has nonvolatile storage capability by being turned on or off upon being selected, the plurality of sub-bit lines are provided correspondingly to the main bit line, and for each column, one side electrodes of the plurality of memory transistors are connected to one of the plurality of sub-bit lines.

During a read period, one selected sub-bit line among the plurality of sub-bit lines and the main bit line are electrically connected and precharged to a predetermined potential, and then one memory transistor among the plurality of memory transistors having the one side electrode connected to the selected sub-bit line enters a selected state, whereby read data is obtained based on the amount of current flowing thorough the main bit line. The resetting means resets at least the selected sub-bit line to a standard potential after the read data is obtained during the read period.

This reliably prevents a slowdown phenomenon of read operation resulting from the precharged charge remaining on the selected sub-bit line, thereby obtaining a nonvolatile semiconductor memory device capable of performing a high-speed read operation.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
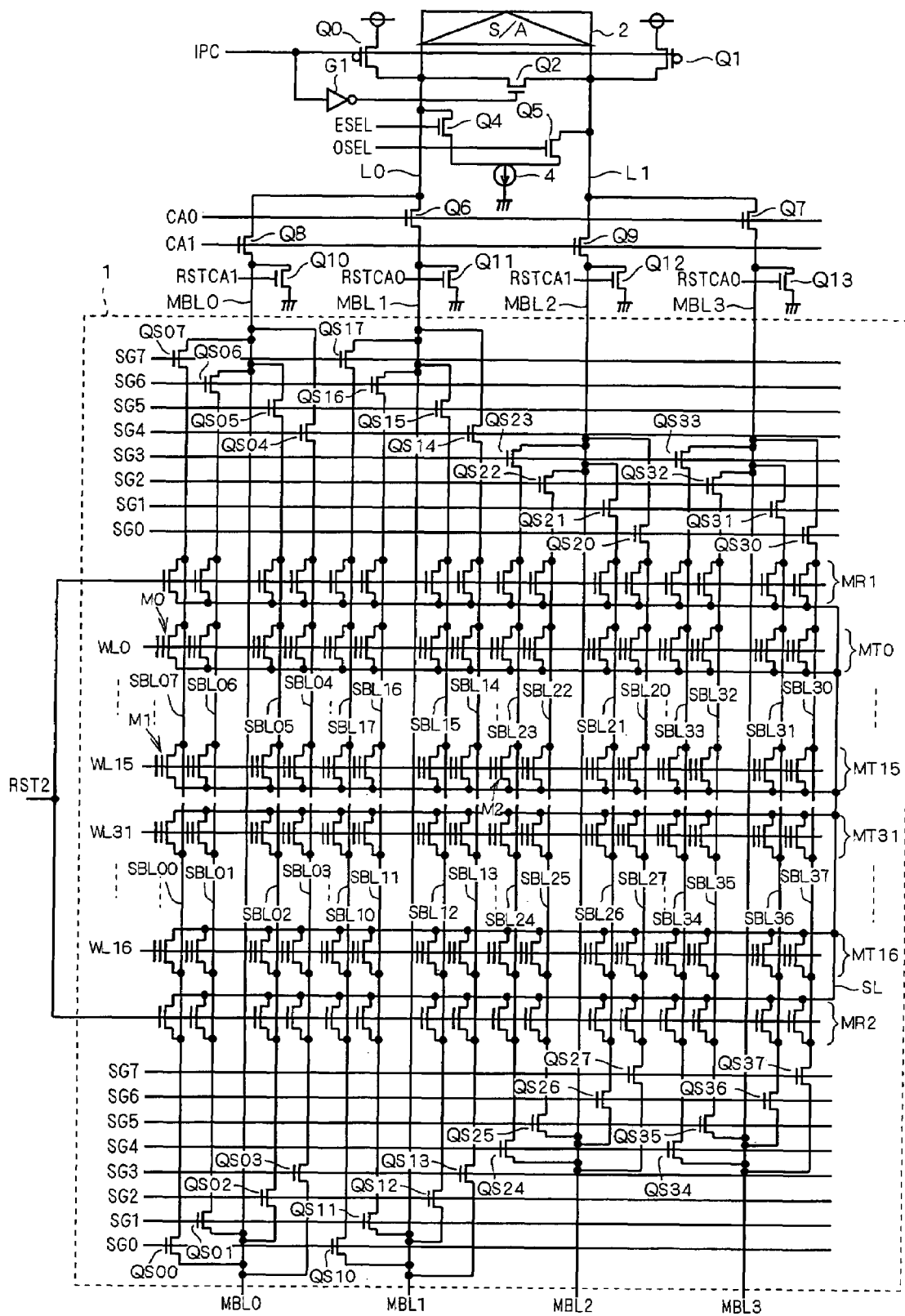
FIG. 1 is a circuit diagram illustrating part of a read circuit configuration in a flash memory according to a first preferred embodiment of the present invention.

FIG. 1 is a circuit diagram illustrating part of a read circuit configuration in a flash memory according to a first preferred embodiment of the present invention. As shown, an erase block 1 is provided correspondingly to one sense amplifier 2. In actuality, a plurality of erase blocks provided correspondingly to a plurality of sense amplifiers constitute a group of erase blocks erasable at a time. For example, to 64 sense amplifiers, 64 erase blocks 1 shown in FIG. 1 may constitute a group of erase blocks of one unit, or 32 sense amplifiers each may constitute a group of erase blocks of two units. Alternatively, a predetermined number of erase blocks 1 shown in FIG. 1 may be further provided in the direction of main bit line.

The sense amplifier 2 is a differential circuit supporting high-speed reading that obtains read data by detecting and amplifying a difference between the amounts of current flowing through sense lines L0 and L1, respectively. Precharge transistors Q0 to Q2 forming a precharge circuit are provided correspondingly to the sense lines L0 and L1. The precharge transistors Q0 and Q1 with PMOS structure have their respective sources connected to a power source Vdd, their respective gates receiving a precharge signal IPC, and drains connected to the sense lines L0 and L1, respectively. The precharge transistor Q2 with NMOS structure is interposed between the sense lines L0 and L1, and has a gate receiving an inversion signal of the precharge signal IPC via an inverter G1.

In addition, comparative current selection transistors Q4 and Q5 with NMOS structure forming a comparative current supply circuit are provided correspondingly to the sense lines L0 and L1. The comparative current selection transistors Q4 and Q5 have drains connected to the sense line L0 and L1, respectively, gates receiving comparative current selection signals ESEL and OSEL, respectively, and their respective sources grounded via a constant current source 4.

Main bit line selection transistors Q6 to Q9 with NMOS structure forming a main bit line selection circuit for selectively connecting the sense lines L0, L1 and main bit lines MBL0 to MBL3 are provided. The main bit line selection transistor Q6 is interposed between the sense line L0 and the main bit line MBL1, the main bit line selection transistor Q7 is interposed between the sense line L1 and the main bit line MBL3, the main bit line selection transistor Q8 is interposed between the sense line L0 and the main bit line MBL0, and the main bit line selection transistor Q9 is interposed between the sense line L1 and the main bit line MBL2.

The main bit line selection transistors Q6 and Q7 have their respective gates receiving a main bit line selection signal CA0, and the main bit line selection transistors Q8 and Q9 have their respective gates receiving a main bit line selection signal CA1. The main bit line selection signals CA0 and CA1 are also termed a Y gate signal.

Main bit line reset transistors Q10 to Q13 with NMOS structure forming a main bit line reset circuit for selectively setting the main bit lines MBL0 to MBL3 to ground level (standard potential) are provided correspondingly to the main bit lines MBL0 to MBL3. The main bit line reset transistors Q10 to Q13 have drains connected to the main bit lines MBL0 to MBL3, respectively, and sources grounded. The main bit line reset transistors Q10 and Q12 have their respective gates receiving a main bit line reset signal RSTCA1, and the main bit line reset transistors Q11 and Q13 have their respective gates receiving a main bit line reset signal RSTCA0.

The main bit lines MBL0 to MBL3 are connected to the erase block 1. The inside of the erase block 1 will be explained below.

The main bit line MBL0 is connected to sub-bit lines SBL00 to SBL03 via sub-bit line selection transistors QS00 to QS03, and connected to sub-bit lines SBL04 to SBL07 via sub-bit line selection transistors QS04 to QS07.

The main bit line MBL1 is connected to sub-bit lines SBL10 to SBL13 via sub-bit line selection transistors QS10 to QS13, and connected to sub-bit lines SBL14 to SBL17 via sub-bit line selection transistors QS14 to QS17.

The main bit line MBL2 is connected to sub-bit lines SBL20 to SBL23 via sub-bit line selection transistors QS20 to QS23, and connected to sub-bit lines SBL24 to SBL27 via sub-bit line selection transistors QS24 to QS27.

The main bit line MBL3 is connected to sub-bit lines SBL30 to SBL33 via sub-bit line selection transistors QS30 to QS33, and connected to sub-bit lines SBL34 to SBL37 via sub-bit line selection transistors QS34 to QS37.

The sub-bit line selection transistors QS00 to QS03, QS10 to QS13, QS20 to QS23, and QS30 to QS33 have gates receiving sub-bit line selection signals SG0 to SG3, and the sub-bit line selection transistors QSO4 to QS07, QS14 to QS17, QS24 to QS27, and QS34 to QS37 have gates receiving sub-bit line selection signals SG4 to SG7. The sub-bit line selection signals SG0 to SG7 are also termed a select gate signal.

Memory transistors MT0 to MT15 and MT16 and MT31 are arranged in a matrix (memory transistors in the same row bear the same sign for the sake of explanation) such that the drains of the memory transistors MT0 to MT15 in each column are connected to any one of the sub-bit lines SBL04 to SBL07, SBL14 to SBL17, SBL20 to SBL23, and SBL30 and SBL33, and the drains of the memory transistors MT16 to MT31 in each column are connected to any one of the sub-bit lines SBL00 to SBL03, SBL10 to SBL13, SBL24 to SBL27, and SBL34 and SBL37. The memory transistors MT0 to MT31 have gates connected to word lines WL0 to WL31.

The sub-bit lines SBLO4 to SBL07, SBL14 to SBL17, SBL20 to SBL23, and SBL30 to SBL33 are each connected to a common source line SL via a corresponding sub-bit line reset transistor MR1 (all of which bear the same sign for the sake of explanation) with NMOS structure, and the sub-bit lines SBL00 to SBL03, SBL10 to SBL13, SBL24 to SBL27, and SBL34 to SBL37 are each connected to the common source line SL via a corresponding sub-bit line reset transistor MR2 (all of which bear the same sign for the sake of explanation) with NMOS structure.

The plurality of sub-bit line reset transistors MR1 and MR2 have their respective gates receiving a sub-bit line reset signal RST2. When the sub-bit line reset transistors MR1 and MR2 are turned on, all of the sub-bit lines are electrically connected to the common source line SL, to be reset to "L".

Figure 2:
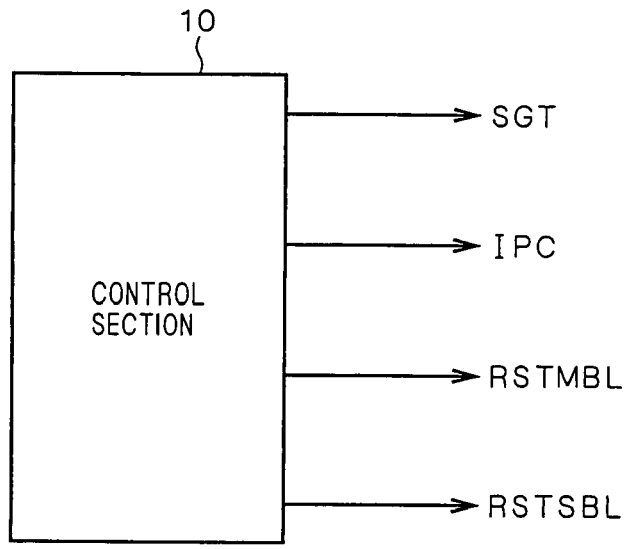
FIG. 2 explains a control section for generating various kinds of control signals concerning the read operation of the flash memory according to the first preferred embodiment.

FIG. 2 explains a control section for generating various kinds of control signals concerning the read operation of the flash memory according to the first preferred embodiment. As shown, the control section 10 controls the read operation by outputting a sub-bit line selection-timing signal SGT, the precharge signal IPC, a main bit line reset-timing signal RSTMBL, and a sub-bit line reset-timing signal RSTSBL.

The sub-bit line selection-timing signal SGT indicates rise and fall timings when selecting the sub-bit line selection signals SG0 to SG7, the timings followed by a not shown sub-bit line selection circuit which decodes a predetermined address to selectively set any one of the sub-bit line selection signals SG0 to SG7 to "H". The main bit line reset-timing signal RSTMBL indicates reset timing of the main bit lines, and the sub-bit line reset-timing signal RSTSBL indicates reset timing of the sub-bit lines.

Figure 3:
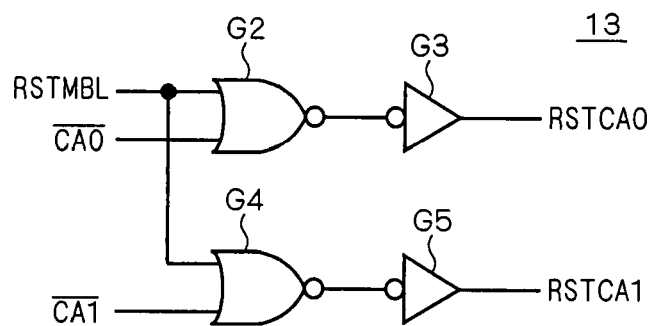
FIG. 3 is a circuit diagram illustrating the configuration of a main bit line reset signal generation circuit.

FIG. 3 is a circuit diagram illustrating the configuration of a main bit line reset signal generation circuit. As shown, a main bit line reset signal generation circuit 13 is composed of NOR gates G2 and G4, and inverters G3 and G5. The NOR gate G2 has one output receiving the main bit line reset-timing signal RSTMBL and the other input receiving $\overline{CA0}$ which is an inversion signal of the main bit line selection signal CA0, and outputs the main bit line reset signal RSTCA0 via the inverter G3. The NOR gate G4 has one input receiving the main bit line reset-timing signal RSTMBL and the other input receiving $\overline{CA1}$ which is an inversion signal of the main bit line selection signal CA1, and outputs the main bit line reset signal RSTCA1 via the inverter G5.

Figure 4:
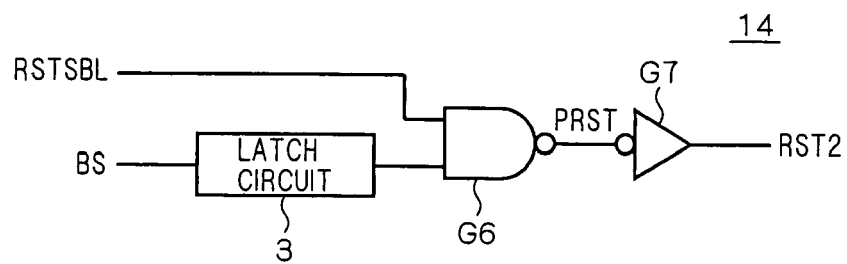
FIG. 4 is a circuit diagram illustrating the configuration of a sub-bit line reset signal generation circuit.

FIG. 4 is a circuit diagram illustrating the configuration of a sub-bit line reset signal generation circuit. As shown, a sub-bit line reset signal generation circuit 14 is composed of a latch circuit 3, a NAND gate G6, and an inverter G7, and is provided for each erase block.

The latch circuit 3 latches a read-block designation signal BS which becomes "H" when a decode result by a not shown block decoder indicates the erase block 1.

The NAND gate G6 has one input receiving the sub-bit line reset-timing signal RSTSBL and the other input receiving the read-block designation signal BS latched into the latch circuit 3, and outputs a pre-reset signal PRST. The pre-reset signal PRST becomes the sub-bit line reset signal RST2 via the inverter 7.

Figure 5:
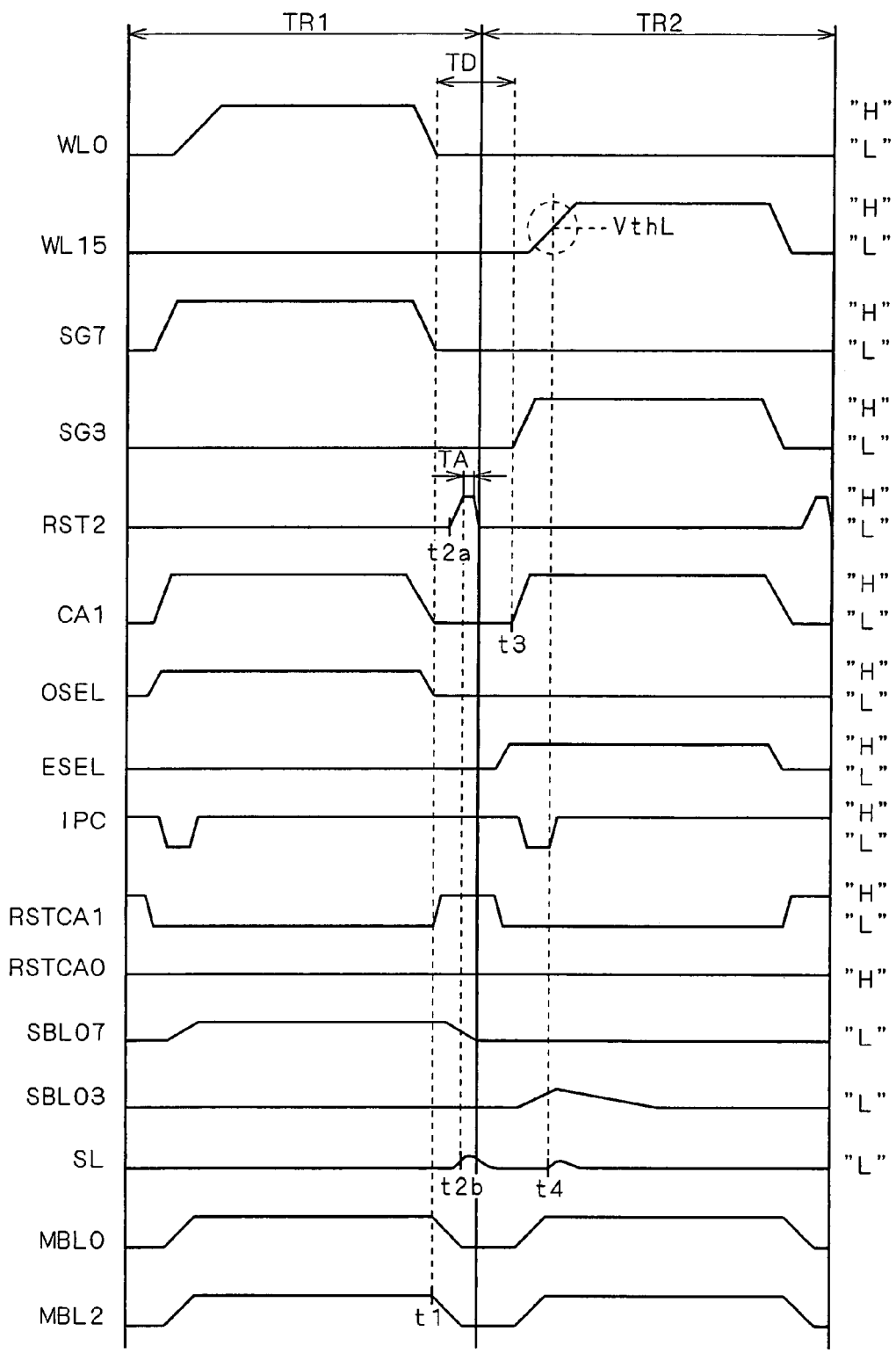
FIG. 5 is a timing diagram illustrating the read operations of the read circuit in the flash memory according to the first preferred embodiment.

FIG. 5 is a timing diagram illustrating two sequential read operations of the read circuit in the flash memory according to the first preferred embodiment. As shown, first and second read operations are sequentially performed during read periods TR1 and TR2.

In the first read operation, the memory transistor MT0 (hereafter referred to as "memory transistor M0") connected to the main bit line MBL0, the sub-bit line SBL07 (selected sub-bit line), and the word line WL0 is accessed, which will be explained below with reference to FIG. 5. Assume that the memory transistor M0 has the "H" threshold voltage VthH.

At the start of the read period TR1, the main bit line selection signal CA1 is set to "H" to turn the main bit line selection transistors Q8 and Q9 on, thus electrically connecting the main bit line MBL0 and the sense line L0, and the main bit line MBL2 and the sense line L1, respectively.

At the same time, the sub-bit line selection signal SG7 is set to "H" to turn the sub-bit line selection transistors QS07 and QS27 on, thus electrically connecting the sub-bit line SBL07 and the main bit line MBL0, and the sub-bit line SBL27 and the main bit line MBL2, respectively.

With this state, the precharge signal IPC is set to "L" to turn the precharge transistors Q0 to Q2 on, thus precharging the sense line L0, the main bit line MBL0, and the sub-bit line SBL07, as well as the sense line L1, the main bit line MBL2, and the sub-bit line SBL27 to the power source voltage Vdd. Alternatively, those lines may be precharged to a potential predetermined by a not shown voltage control circuit rather than to the power source voltage Vdd.

After that, the comparative current selection signal OSEL and the word line WL0 are set to "H" (read voltage) to turn the comparative current selection transistor Q5 on, and render the memory transistor MT0 (memory transistor M0) that is electrically connected to the sub-bit line selection signal SG7 into a selected state.

Accordingly, the memory transistor M0 and the sense line L0 which is to be the read side are electrically connected via the main bit line MBL0 and the sub-bit line SBL07, and the sense line L1 which is to be the reference side is fed with a reference current by the constant current source 4, and is electrically connected to the main bit line MBL2 and the sub-bit line SBL27 (all of the memory transistors MT16 to MT31 connected thereto are non-elected).

Current hardly flows through the sense line L0 when the memory transistor M0 has the "H" threshold voltage VthH (which is higher than read voltage) and is thus in an off state, while current larger than the reference current flows through the sense line L0 when the memory transistor M0 has the "L" threshold voltage VthL (which is lower than read voltage) and is thus in an on state. Thus, the amount of current flowing through the sense line L0 is reversed with respect to the reference current depending on the on/off state of the memory transistor M0, allowing a difference between the amounts of current flowing through the sense lines L0 and L1 to be detected and amplified by the sense amplifier 2 to obtain read data.

In the above assumption, the memory transistor M0 has the "H" threshold voltage VthH. Accordingly, the memory transistor M0 is in an off state, and current hardly flows through the sense line L0. In contrast, the reference current flows through the sense line L1. Therefore, the sense amplifier 2 is capable of obtaining read data by detecting and amplifying a difference between the amounts of current flowing through the sense lines L0 and L1.

Subsequently, at time t1 after the above read data is obtained during the read period TR1, the world line WL0, the sub-bit line selection signal SG7, the main bit line selection signal CA1, and the comparative current selection signal ESEL fall to "L". After that, the sub-bit line reset signal RST2 rises to "H" from time t2a until time t2b and remains in "H" during a period TA after time t2b.

Consequently, a reset operation is performed in which the sub-bit line reset transistors MR1 and MR2 are turned on to electrically connect all of the sub-bit lines SBLi0 to SBLi7 (i=0 to 3) to the common source line SL. Accordingly, the sub-bit line SBL07 starts falling to "L" after time t2a, and is reliably reset to "L" by the time of starting the next read period TR2. At this time, the common source line SL is subjected to potential fluctuations, but recovers to "L" by the time of selecting a memory transistor during the next read period TR2. Thus there arises no problem.

In this manner, even when charge from the time of precharging remains on the sub-bit line SBL07 when the memory transistor M0 has the "H" threshold voltage VthH, the accumulated charge on the sub-bit line SBL07 is discharged to the common source line SL by the reset operation during the period TA after the read data is obtained during the read period TR1. This reliably prevents the charge from remaining on the sub-bit line SBL07 at time t3 (when the bit line selection signal SG3 and the main bit line selection signal CA1 start rising) in the next read period TR2.

Accordingly, when the word line WL15 becomes "H" at time t4, even when the memory transistor MT15 (hereafter referred to as "memory transistor M1") connected to the sub-bit line SBL07 and the word line WL 15 has the "L" threshold voltage VthL, the common source line SL is not subjected to potential fluctuations (floating state from "L") via the memory transistor M1 in an on state because the sub-bit line SBL07 has been set to "L" by the reset operation.

Therefore, the potential fluctuations of the common source line SL, which are only affected by the memory transistor MT15 (hereafter referred to as "memory transistor M2") connected to the sub-bit line SBL23 and the word line WL15, can be suppressed almost by half as compared with conventional fluctuations. In short, whereas the common source line SL conventionally had a chance of being subjected to potential fluctuations by two memory transistors at worst, the common source line SL in the first preferred embodiment is subjected to potential fluctuations by one memory transistor even at worst.

If the assumption is made, for example, that the fluctuations of the common source line SL caused by one memory transistor being turned on is 0.1 V, conventional potential fluctuations of the common source line SL of approximately 0.2 V at worst can be suppressed to approximately 0.1 V in the first preferred embodiment. An instance will be explained below where potential fluctuations caused by one memory transistor being turned on is calculated to be 0.1V. When the precharge potential of the sub-bit lines SBL is 0.7 V, and the capacity of the sub-bit lines SBL is 0.1 pF, 70 f coulomb of charge remains per bit. In a normal read operation of 32 bits or 64 bits together, charge of 70 f coulomb×32 (64) flows into the common source line SL at a stroke. When the potential fluctuations of the common source line SL in reading of 64 bits with the resistance value of the common source line SL being 3 KΩ were circuit-simulated by modeling R, C information of pertinent layout portions, the calculation indicated a saving of charge of approximately 0.1 V.

Here, if the assumption is made that an ideal cell current flowing through a memory transistor in an on state when the precharge potential of the sub-bit lines SBL is 0.7 V and the common source line SL has 0 V (standard potential) is 35 μA, a conventional cell current is 25 μA due to the potential fluctuations of 0.2 V of the common source line SL, whereas a cell current in the first preferred embodiment is 30 μA due to the potential fluctuations of only 0.1V of the common source line SL. Here, when the reference current is set to half the ideal cell current of 35 μA, i.e. to 17 μA, then a conventional difference from the reference current is only 8 (=25−17) μA, whereas the difference in the first preferred embodiment is 13 (=30−17) μA, allowing a reduction of sensing time by the sense amplifier 2 almost by ⅔ thus achieving speedup in read time.

In this manner, the flash memory according to the first preferred embodiment resets the selected sub-bit line (sub-bit line SBL07 in the read period TR1) to "L" after obtaining the read data in the read period TR1, by using sub-bit line resetting means composed of the control section 10 (output of the sub-bit line reset-timing signal RSTSBL), the sub-bit line reset signal generation circuit 14, and the sub-bit line reset transistors MR1 and MR2. This reliably prevents a slowdown phenomenon of read operation which is involved in the potential fluctuations of the common source line SL resulting from the precharged charge remaining on the selected sub-bit line, thereby obtaining a flash memory capable of performing a high-speed read operation.

In addition, a data processor intended for speedup in reading will be obtained by mounting this flash memory.

Note that the "H" levels of the word lines WL0 to WL31, the sub-bit line selection signals SG0 to SG7, and the main bit line selection signals CA0 to CA1 are set higher than the normal power source voltage Vdd through the use of an inner booster circuit (not shown).

Because of this, erroneous selection of address and the like causes a multiple-selection phenomenon of address in which the word lines WL are selected more than twice during a single read period, placing a burden on the inner booster circuit. In order to prevent such phenomenon from occurring, a period during which no word lines WL are selected is provided for 1 to 2 nanoseconds at the end of the read period TR1, like a period TD shown in FIG. 5. Thus, there arises a period during which the word lines WL0 to WL31, the sub-bit line selection signals SG0 to SG7, and the main bit line selection signals CA0 to CA1 are all set to "L".

Second Preferred Embodiment

Figure 6:
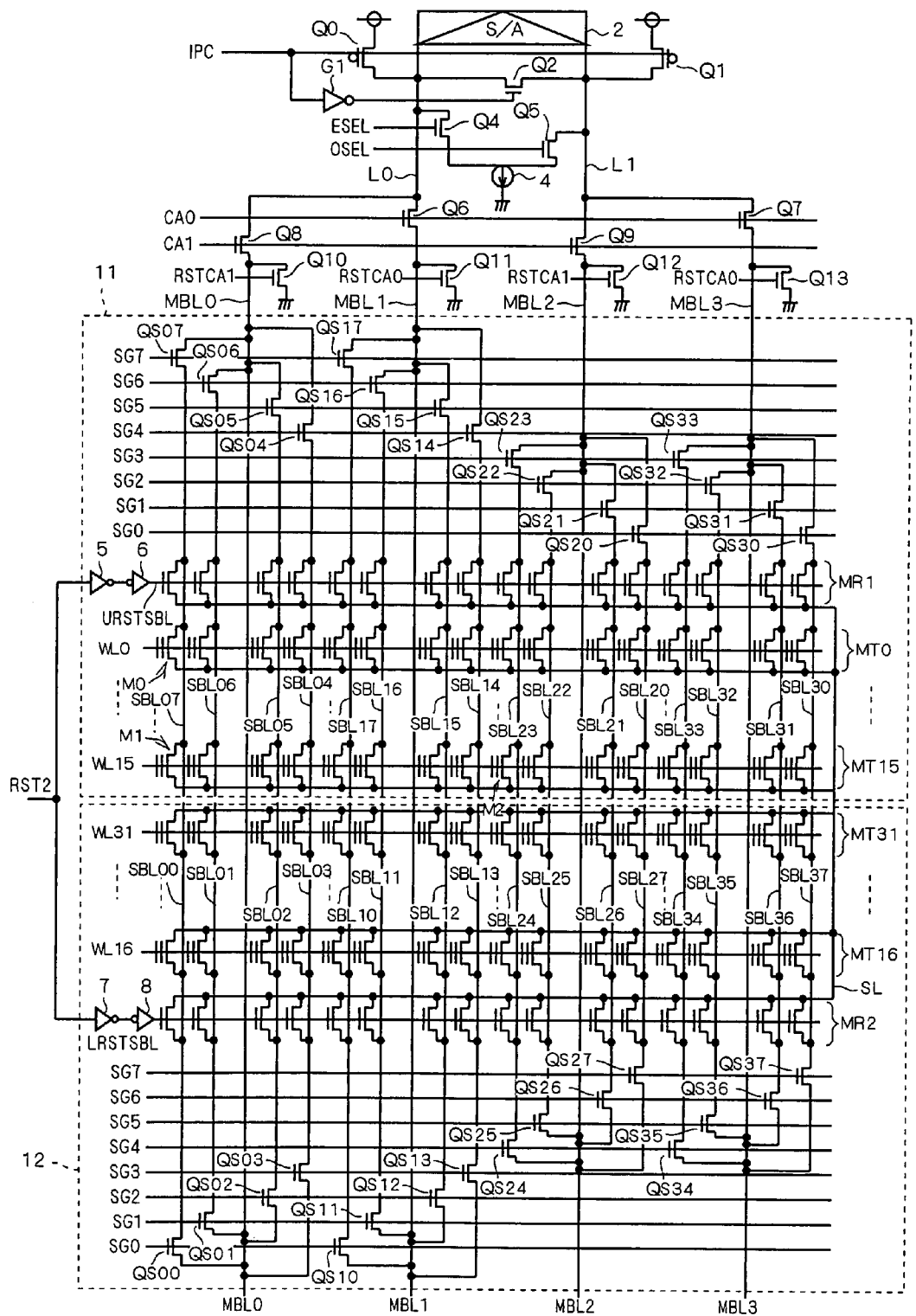
FIG. 6 is a circuit diagram illustrating part of a read circuit configuration in a flash memory according to a second preferred embodiment of the present invention.

FIG. 6 is a circuit diagram illustrating part of a read circuit configuration in a flash memory according to a second preferred embodiment of the present invention. As shown, inversion buffers 5 and 7 having their respective inputs receiving the sub-bit line reset signal RST2 are provided, and inversion buffers 5 and 6 connected in series output an upper sub-bit line reset signal URSTSBL to the gates of the sub-bit line reset transistors MR1, while inversion buffers 7 and 8 connected in series output a lower sub-bit line reset signal LRSTSBL to the gates of the sub-bit line reset transistors MR2.

In the second preferred embodiment, the sub-bit lines SBLO4 to SBL07, SBL14 to SBL17, SBL20 to SBL23, SBL30 to SBL33, and the memory transistors MT0 to MT15, the word lines WL0 to WL15 and the like connected by the upper sub-bit line reset signal URSTSBL form an erase block 11, and the sub-bit lines SBL00 to SBL03, SBL10 to SBL13, SBL24 to SBL27, SBL34 to SBL37, and the memory transistors MT16 to MT31, the word lines WL16 to WL31 and the like connected by the lower sub-bit line reset signal LRSTSBL form an erase block 12. The remaining elements are the same as those in the first preferred embodiment as shown in FIG. 1, so the explanations thereof are omitted.

In this manner, the flash memory according to the second preferred embodiment includes first sub-bit line resetting means composed of the control section 10, the sub-bit line reset signal generation circuit 14, the inversion buffers 5, 6 and the sub-bit line reset transistor MR1, for setting the sub-bit lines SBL04 to SBL07 and the like in the erase block 11 to "L", and second sub-bit line resetting means composed of the control section 10, the sub-bit line reset signal generation circuit 14, the inversion buffers 7, 8 and the sub-bit line reset transistor MR2, for setting the sub-bit lines SBL00 to SBL03 and the like in the erase block 12 to "L". And the first and second sub-bit line resetting means are capable of exerting independent driving abilities of each other.

Figure 7:
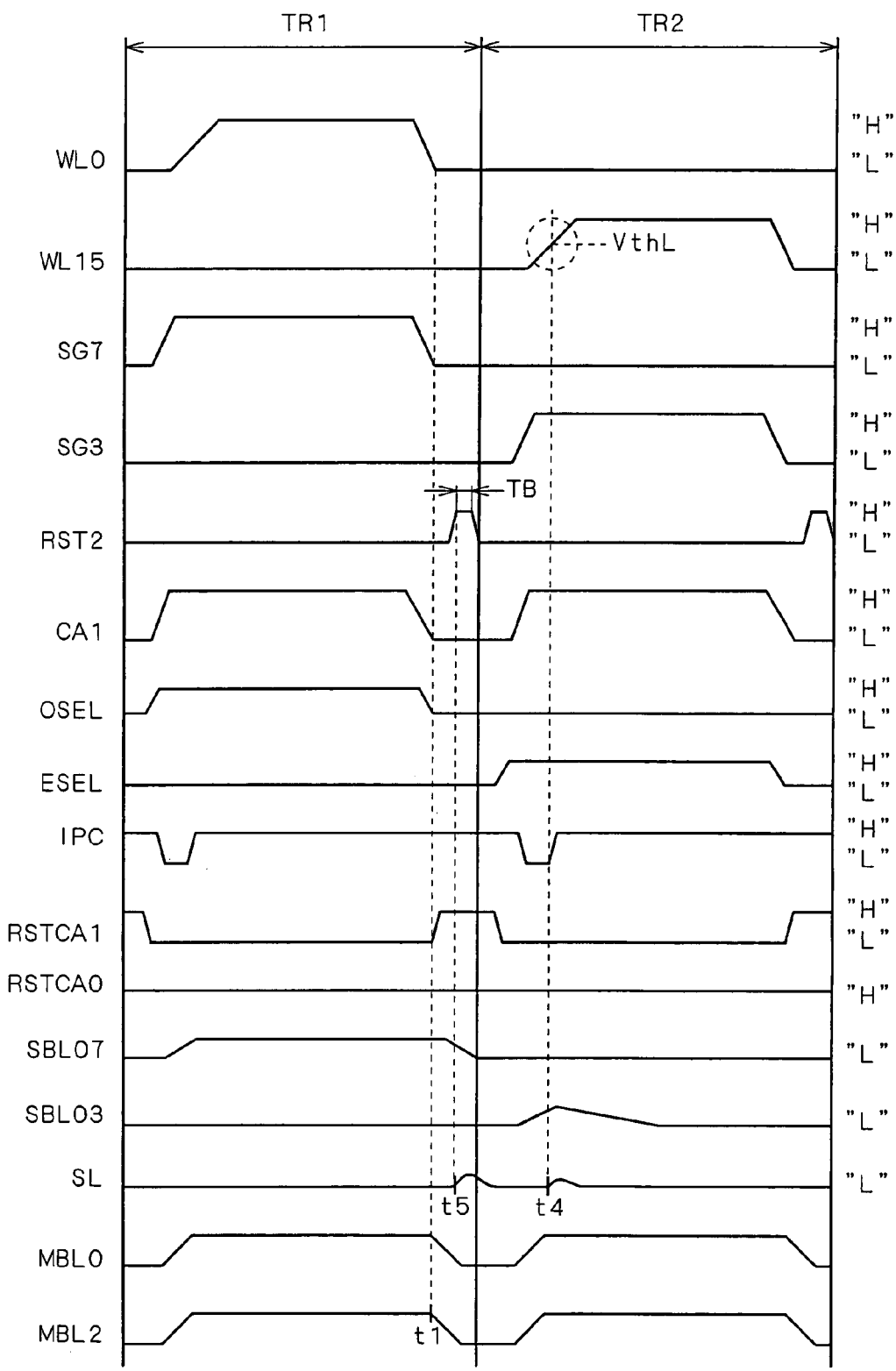
FIG. 7 is a timing diagram illustrating the read operations of the read circuit in the flash memory according to the second preferred embodiment.

FIG. 7 is a timing diagram illustrating two sequential read operations of the read circuit in the flash memory according to the second preferred embodiment. As shown, first and second read operations are sequentially performed during the read periods TR1 and TR2, in the same way as the first preferred embodiment.

Only the different respects from the first preferred embodiment will be explained below. The upper sub-bit line reset signal URSTSBL and the lower sub-bit line reset signal LRSTSBL become "H" during a period TB after time t5 after the read data is obtained during the read period TR1, whereby all of the sub-bit lines in the erase blocks 11 and 12 are reset to "L". At this time, the common source line SL is subjected to potential fluctuations, but recovers to "L" by the time of selecting the memory transistor M2 during the next read period TR2. Thus there arises no problem.

With the first and second sub-bit line resetting means performing reset operations with independent driving abilities of each other to the erase blocks 11 and 12, respectively, the number of sub-bit line reset transistors to be driven can be reduced by half as compared with the first preferred embodiment.

The sub-bit line reset signal RST2 shown in FIG. 1, and the upper sub-bit line reset signal URSTSBL and the lower sub-bit line reset signal LRSTSBL shown in FIG. 6 are each shared in a group of erase blocks. Namely, with a plurality of structures corresponding to the erase block 1 shown in FIG. 1, for example, the sub-bit line reset signal RST2 is shared in a group of erase blocks of one unit composed of the plurality of erase blocks 1, and with a plurality of structures corresponding to the erase blocks 11 and 12 shown in FIG. 6, the upper sub-bit line reset signal URSTSBL is shared in a first group of erase blocks of one unit composed of the plurality of erase blocks 11, and the lower sub-bit line reset signal LRSTSBL is shared in a second group of erase blocks of one unit composed of the plurality of erase blocks 12.

For example, in the case of 8 sub-bit lines per 1 main bit line in each block, 8 main bit lines per 1 sense amplifier, and 64 sense amplifiers, approximately 4000 sub-bit line reset transistors need to be driven in the first preferred embodiment, whereas that number can be reduced to approximately 2000 in the second preferred embodiment.

In this manner, the flash memory according to the second preferred embodiment resets the selected sub-bit lines to "L" after obtaining the read data in the read period TR1, by using the sub-bit line resetting means composed of the control section 10, the sub-bit line reset signal generation circuit 14, the inversion buffers 5 to 8, and the sub-bit line reset transistors MR1 and MR2. This achieves high-speed read operation in the same way as the first preferred embodiment.

Also in the second preferred embodiment, with the reduction in the number of sub-bit line reset transistors to be driven by half as compared with the first preferred embodiment, the lower sub-bit line reset signal LRSTSBL and the upper sub-bit line reset signal URSTSBL obtain a better improvement in waveform rounding than the sub-bit line reset signal RST2 does, and the period TB during which the reset operation is active can be set correspondingly longer than the period TA in the first preferred embodiment, thus attaining a better reset characteristic than in the first preferred embodiment.

However, due to signal transmission by the inversion buffers 5, 6 and 7, 8, rise timings of the upper sub-bit line reset signal URSTSBL and the lower sub-bit line reset signal LRSTSBL are correspondingly delayed by two stages of buffers as compared with that of the sub-bit line reset signal RST2 in the first preferred embodiment.

Although the erase block is divided into two erase blocks each of which is provided with buffers in the second preferred embodiment, the erase block may alternatively be divided into three or more erase blocks each of which is provided with buffers. For example, the sub-bit lines selected by the sub-bit line selection signals SG4 to SG7 may be further divided into two or more lines, or the sub-bit lines selected by the sub-bit line selection signals SG0 to SG3 may be further divided into two or more lines.

It is to be noted, however, because an increase in the number of divided erase blocks involves a corresponding increase in layout area due to the provision of buffers, it is desirable that the number of divided erase blocks be determined in view of the driving ability required for reset operation.

Third Preferred Embodiment

A read circuit configuration in a flash memory according to a third preferred embodiment of the present invention is the same as shown in FIG. 6 of the second preferred embodiment. The difference is the fall timing indicated by the sub-bit line selection-timing signal SGT and the rise timing indicated by the main bit line reset-timing signal RSTMBL in the control section 10 shown in FIG. 2.

Figure 8:
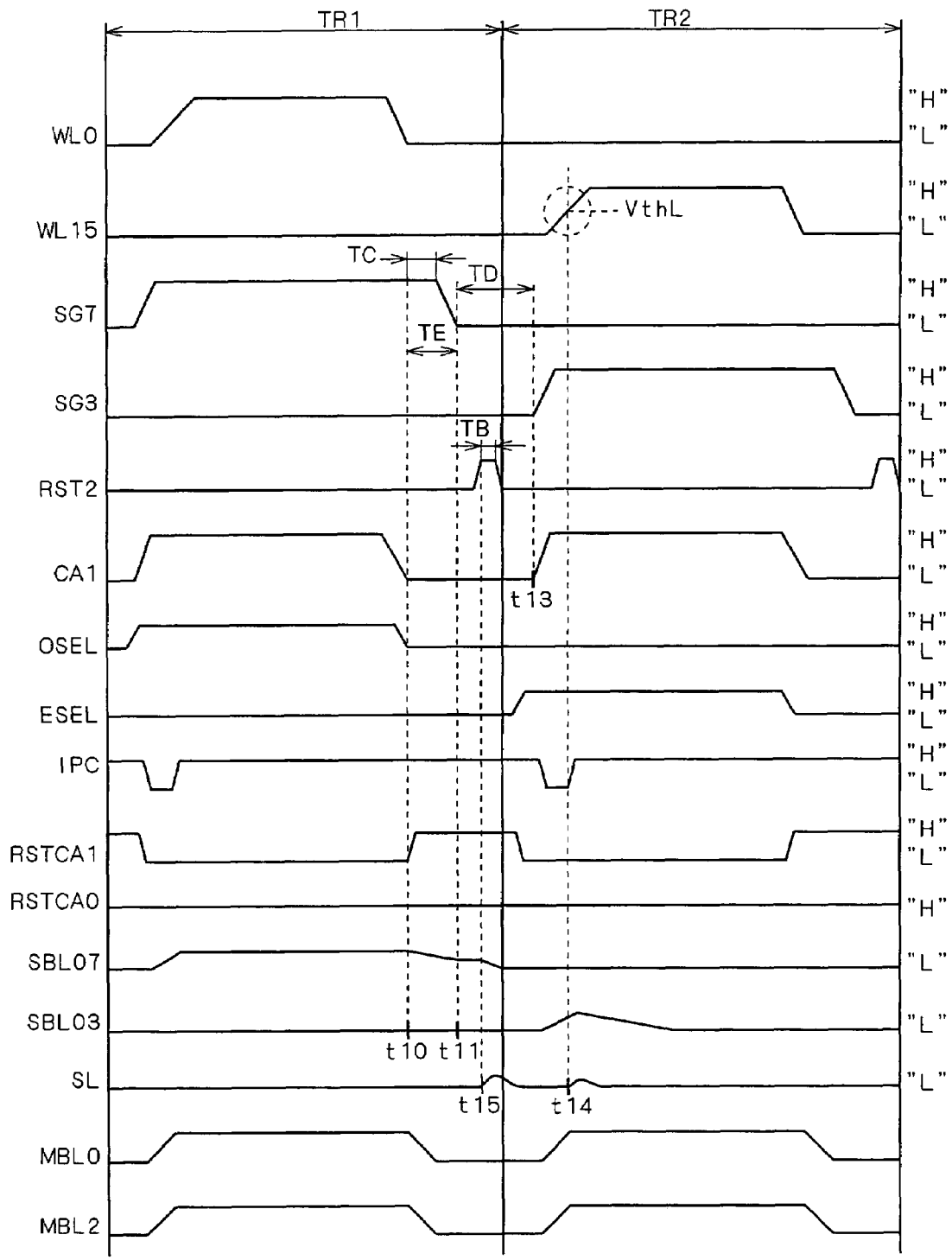
FIG. 8 is a timing diagram illustrating the read operations of a read circuit in a flash memory according to a third preferred embodiment of the present invention.

FIG. 8 is a timing diagram illustrating two sequential read operations of the read circuit in the flash memory according to the third preferred embodiment. As shown, first and second read operations are sequentially performed during the read periods TR1 and TR2, in the same way as the first and second preferred embodiments.

Only the different respects from the second preferred embodiment will be explained below. The sub-bit line selection signal SG7 falls at time t11 which is delayed by a period TE from time t10 when the word line WL0, the main bit line selection signal CA1, and the comparative current selection signal OSEL fall to "L". In addition, the main bit line reset signal RSTCA1 rises to "H" from time t10.

Consequently, during a period TC after time t10, the sub-bit line selection signal SG7 is "H", so the sub-bit line SBL07 is electrically connected to ground level via the main bit line reset transistor Q10 in an on state, the main bit line MBL0, and the sub-bit line selection transistor QS07. This is followed by a first reset operation in which the sub-bit line SBL07 falls to "L".

That is, the first reset operation is performed on the sub-bit line SBL07 by main bit line resetting means composed of the control section 10 (output of the main bit line reset-timing signal RSTMBL and output of the sub-bit line selection-timing signal SGT), the main bit line reset signal generation circuit 13, and the main bit line reset transistors Q10 to Q13.

After that, the upper sub-bit line reset signal URSTSBL and the lower sub-bit line reset signal LRSTSBL become "H" during the period TB after time t15 at the tail end of the read period TR1, in the same way as the second preferred embodiment, whereby a second reset operation is performed.

That is, a second reset operation is performed on the sub-bit line SBL07 by sub-bit line resetting means composed of the control section 10, the sub-bit line reset signal generation circuit 14, the inversion buffers 5 to 8, and the sub-bit line reset transistors MR1 and MR2, in the same way as the second preferred embodiment.

In this manner, the sub-bit line SBL07 is reliably reset to "L" by the first and second reset operations with the main bit line and sub-bit line resetting means in the third preferred embodiment. The period TC during which the first reset operation is active is provided, and the read period TR1 becomes correspondingly longer than that of the second preferred embodiment. Nevertheless, the first reset operation is added to the second reset operation, so a burden on the sub-bit line resetting means can be correspondingly reduced, allowing a reduction in channel widths of the sub-bit line reset transistors MR1 and MR2. When the channel widths of the sub-bit line reset transistors MR1 and MR2 are reduced, it is desirable that the channel widths of the main bit line reset transistors Q10 to Q13 forming the main bit line resetting means be correspondingly widened.

The main bit line reset transistors Q10 to Q13 correspond to the main bit lines MBL0 to MBL3 respectively, and are provided one by one for each main bit line MBL, whereas the sub-bit line reset transistors MR1 and MR2 are required in groups of eight for each main bit line MBL. Also, when one main bit line additionally has a plurality of erase blocks provided in the direction thereof, sub-bit line reset transistors will be required in the same number as the erase blocks. Therefore, the layout area is reduced more effectively with reduction in channel widths of the sub-bit line reset transistors even with increase in channel widths of the main bit line reset transistors. In addition, a burden on the inversion buffer 5 (6) can be reduced with reduction in channel widths of the sub-bit line reset transistors, allowing the period TB to be extended and the second reset operation to be performed more excellently.

Fourth Preferred Embodiment

Figure 9:
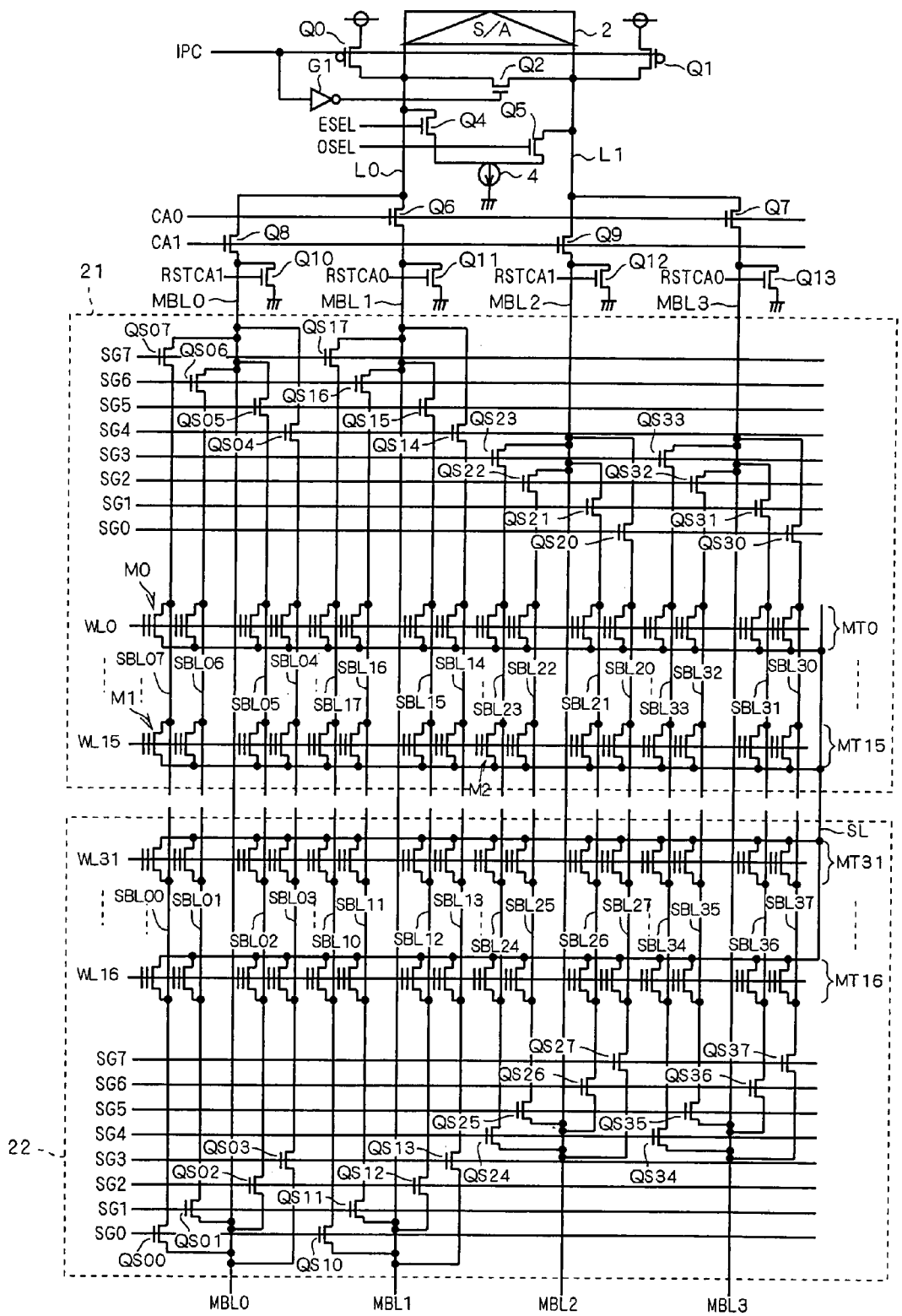
FIG. 9 is a circuit diagram illustrating part of a read circuit configuration in a flash memory according to a fourth preferred embodiment of the present invention.

FIG. 9 is a circuit diagram illustrating part of a read circuit configuration in a flash memory according to a fourth preferred embodiment of the present invention. As shown, erase blocks 21 and 22 having the same structures as the erase blocks 11 and 12 as shown in FIG. 6 of the second preferred embodiment are provided.

The differences from the erase blocks 11 and 12 are that the erase block 21 is not provided with a structure that corresponds to the sub-bit line reset transistor MR1 for resetting the sub-bit lines SBL04 to SBL07, SBL14 to SBL17, SBL20 to SBL23, and SBL30 to SBL33, and that the erase block 22 is not provided with a structure that corresponds to the sub-bit line reset transistor MR2 for resetting the sub-bit lines SBL00 to SBL03, SBL10 to SBL13, SBL24 to SBL27, and SBL34 to SBL37.

In short, the fourth preferred embodiment is different from the third preferred embodiment in that the sub-bit line resetting means are not provided.

Figure 10:
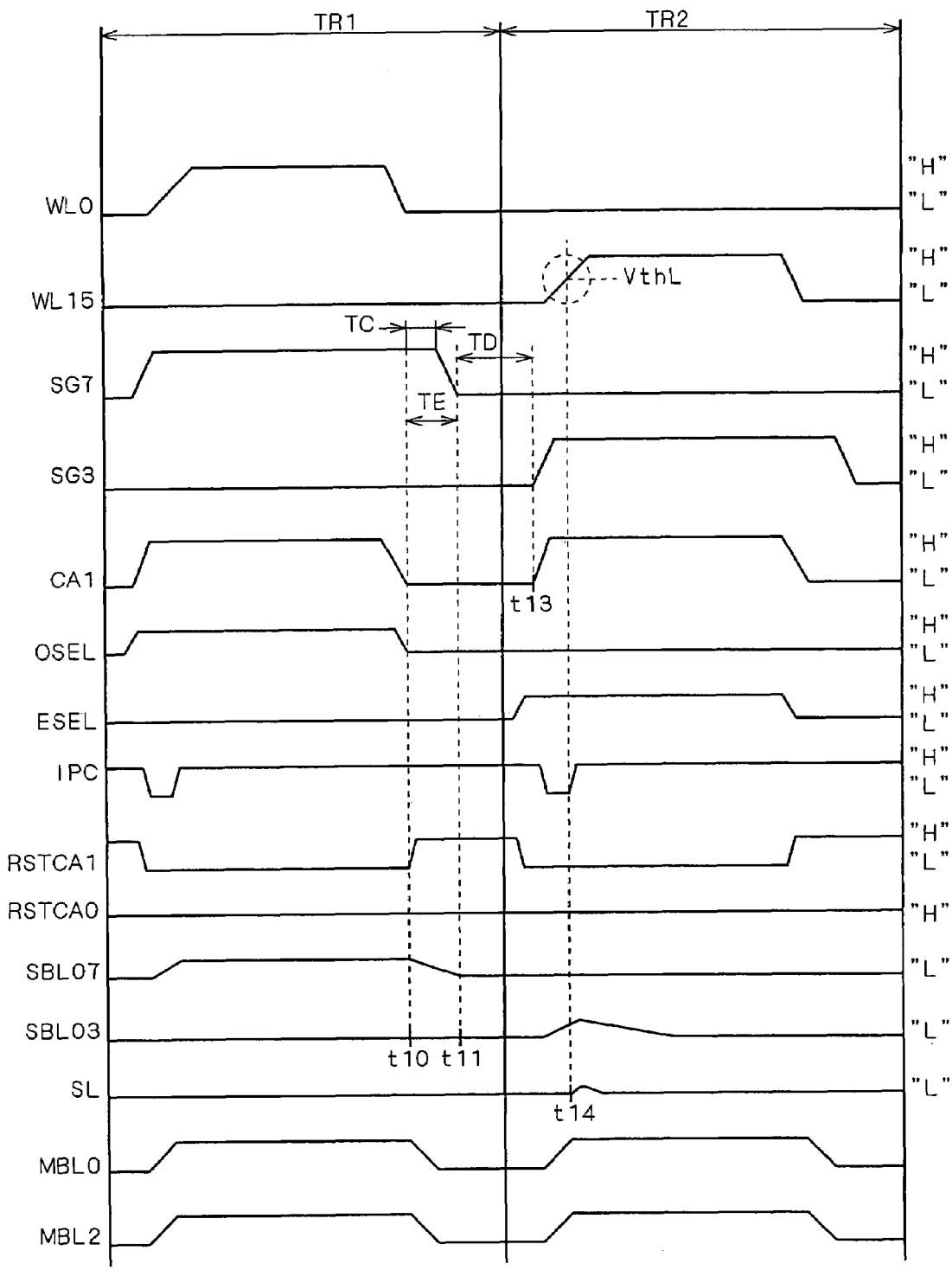
FIG. 10 is a timing diagram illustrating the read operations of the read circuit in the flash memory according to the fourth preferred embodiment.

FIG. 10 is a timing diagram illustrating two sequential read operations of the read circuit in the flash memory according to the fourth preferred embodiment. As shown, first and second read operations are sequentially performed during the read periods TR1 and TR2, in the same way as the first to third preferred embodiments.

Only the different respects from the second preferred embodiment will be explained. The sub-bit line selection signal SG7 falls at time t11 that is delayed by the period TE from time t10 when the word line WL0, the main bit line selection signal CA1, and the comparative current selection signal OSEL fall to "L". In addition, the main bit line reset signal RSTCA1 rises to "H" from time t10.

Consequently, during the period TC after time t10, the sub-bit line selection signal SG7 is "H", so the sub-bit line SBL07 is electrically connected to ground level via the main bit line reset transistor Q10 in an on state, the main bit line MBL0, and the sub-bit line selection transistor QS07. This is followed by a first reset operation by the main bit line resetting means in the same way as the third preferred embodiment, in which the sub-bit line SBL07 falls to "L". The sub-bit line SBL07 is reset to "L" level only by this first reset operation.

In the fourth preferred embodiment, the sub-bit line SBL07 is reliably reset to "L" only by the first reset operation by the main bit line resetting means, through the optimization of the channel widths of the main bit line reset transistors Q10 to Q13 in the main bit line resetting means. That is, the sub-bit line SBL07 is reliably reset to "L" by time t11 when the sub-bit line selection signal SG7 falls to "L".

This allows a reduction in area that corresponds to the sub-bit line reset transistors MR1 and MR2 forming the sub-bit line resetting means, which in turn allows a reduction in layout area thus solving the first problem of an increase in area mentioned in the background art. For example, assuming that the channel widths of the sub-bit line reset transistors MR1 and MR2 are 2 μm, and 8 erase blocks corresponding to the erase blocks 21 and 22 are provided in the direction of main bit lines, the length in the direction of the main bit lines MBL0 to MBL3 is reduced by 32 (2×2×8) μm. Accordingly, even with an increase of 2 μm in the channel widths of the main bit line reset transistors Q10 to Q13, the length reduction of approximately 30 μm in the direction of main bit lines attains a significant reduction in layout area.

While the invention has been shown and described in detail, the foregoing description is in all aspects illustrative and not restrictive. It is therefore understood that numerous modifications and variations can be devised without departing from the scope of the invention.

What is claimed is:

1. A nonvolatile semiconductor memory device comprising:

a plurality of memory transistors having nonvolatile storage capability;

a main bit line;

a plurality of sub-bit lines provided correspondingly to said main bit line, wherein one side electrode of each one of said plurality of memory transistors is respectively connected to one of said plurality of sub-bit lines, and wherein, during a read period, one selected sub-bit line among said plurality of sub-bit lines and said main bit line are electrically connected and precharged to a predetermined potential, and then one memory transistor among said plurality of memory transistors having said one side electrode connected to said selected sub-bit line enters a selected state, whereby read data is obtained based on the amount of current flowing thorough said main bit line, wherein said nonvolatile semiconductor memory device further comprises:

resetting means resetting said main bit line and said selected sub-bit line to a standard potential after said read data is obtained during said read period, and wherein said resetting means includes:

main bit line resetting means resetting said main bit line to said standard potential; and sub-bit line resetting means resetting said plurality of sub-bit lines to said standard potential.

2. The nonvolatile semiconductor memory device according to claim 1, wherein
said sub-bit line resetting means resets said plurality of sub-bit lines to said standard potential at a time.

3. The nonvolatile semiconductor memory device according to claim 2, wherein
said plurality of sub-bit lines are classified into a plurality of first and second sub-bit lines,
said sub-bit line resetting means includes first sub-bit line resetting means resetting said plurality of first sub-bit lines to said standard potential, and second sub-bit line resetting means resetting said plurality of second sub-bit lines to said standard potential, and
said first and second sub-bit line resetting means have independent driving abilities of each other.

* * * * *